US 8,029,872 B2

(12) United States Patent  
Ward

(10) Patent No.: US 8,029,872 B2  
(45) Date of Patent: Oct. 4, 2011

(54) APPLICATION OF A COATING FORMING MATERIAL ONTO AT LEAST ONE SUBSTRATE

(75) Inventor: Luke Ward, Durham (GB)

(73) Assignee: P2i Limited, Abingdon (GB)

(*) Notice: Subject to any disclaimer, the term of this patent is extended or adjusted under 35 U.S.C. 154(b) by 0 days.

(21) Appl. No.: 10/516,448

(22) PCT Filed: May 30, 2003

(86) PCT No.: PCT/GB03/02377  
§ 371 (c)(1), (2), (4) Date: May 16, 2005

(87) PCT Pub. No.: WO03/101621  
PCT Pub. Date: Dec. 11, 2003

(65) Prior Publication Data  
US 2005/0227018 A1 Oct. 13, 2005

(30) Foreign Application Priority Data  
Jun. 1, 2002 (GB) .................................. 0212848.6

(51) Int. Cl.  
H05H 1/24 (2006.01)

(52) U.S. Cl. ........................................................ 427/569

(58) Field of Classification Search .................. 427/569  
See application file for complete search history.

(56) References Cited

U.S. PATENT DOCUMENTS

| 4,603,030 A | 7/1986 | McCarthy |
| 4,629,604 A | 12/1986 | Spector |
| 4,693,799 A | 9/1987 | Yanagihara et al. |
| 4,824,690 A * | 4/1989 | Heinecke et al. ............. 427/577 |
| 4,952,024 A | 8/1990 | Gale |
| 5,105,761 A | 4/1992 | Charlet et al. |
| 5,260,105 A * | 11/1993 | Wang ............................. 427/576 |
| 5,366,770 A | 11/1994 | Wang |
| 5,591,409 A | 1/1997 | Watkins |
| 5,609,921 A * | 3/1997 | Gitzhofer et al. ............. 427/446 |
| 5,876,753 A | 3/1999 | Timmons et al. |
| 6,001,426 A | 12/1999 | Witherspoon et al. |
| 6,012,647 A * | 1/2000 | Ruta et al. .................. 239/132.1 |

(Continued)

FOREIGN PATENT DOCUMENTS

DE 3618630 12/1987

(Continued)

OTHER PUBLICATIONS

Bailey, The generation and measurement of aerosols, Journal of Material Science 9, 1974, p. 1344-1362.*

(Continued)

Primary Examiner — Timothy Meeks  
Assistant Examiner — Elizabeth Burkhart  
(74) Attorney, Agent, or Firm — Winstead P.C.

(57) ABSTRACT

The invention relates to a method and apparatus for the formation of a coating on a substrate. The coating is formed by the deposition of a coating forming material onto the substrate in an atomised form via a nozzle, nebulizer or the like. The material is applied and directed to pass through an exciting medium such as a plasma. The exciting medium is generated and formed in a pulsed manner. The coating forming material passes onto the substrate which can be positioned within the exciting medium or externally of the same.

27 Claims, 2 Drawing Sheets

U.S. PATENT DOCUMENTS

Figure 1A:
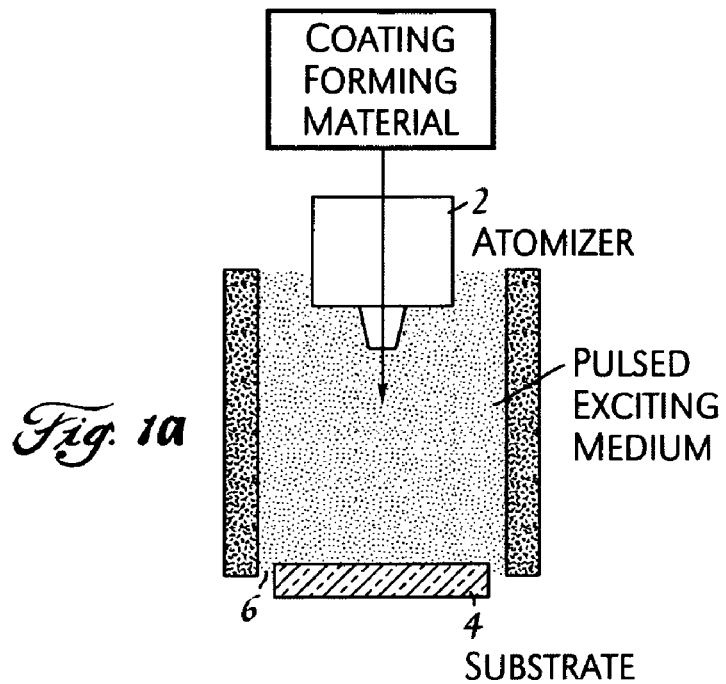

| | | | |
|---|---|---|---|
| 6,146,503 | A | 11/2000 | Sindzingre et al. |
| 6,245,396 | B1 | 6/2001 | Nogami |
| 6,287,643 | B1 | 9/2001 | Powell et al. |
| 6,402,126 | B2 * | 6/2002 | Vaartstra et al. ............ 261/141 |
| 6,427,623 | B2 | 8/2002 | Ko |
| 6,551,950 | B1 * | 4/2003 | Badyal et al. ................. 442/79 |
| 2002/0004104 | A1 | 1/2002 | Timmons et al. |
| 2002/0036358 | A1 | 3/2002 | Watkins |
| 2004/0022945 | A1 * | 2/2004 | Goodwin et al. ....... 427/255.27 |

FOREIGN PATENT DOCUMENTS

| | | |
|---|---|---|
| EP | 0431951 | 7/1990 |
| EP | 0896935 A2 | 2/1999 |
| WO | 9858117 A1 | 12/1998 |
| WO | WO 98/58117 * | 12/1998 |
| WO | 9940758 | 8/1999 |
| WO | 0005000 A1 | 2/2000 |
| WO | 0228548 | 4/2002 |
| WO | 0228548 A2 | 4/2002 |
| WO | WO 02/28548 | 4/2002 |
| WO | WO 02/28548 A | 4/2002 |
| WO | 03097245 A2 | 11/2003 |
| WO | WO 03/097245 | 11/2003 |
| WO | WO 03/097245 A2 | 11/2003 |

OTHER PUBLICATIONS

Bailey, The Generation and Measurement of Aerosols, Journal of Material Science 9, 1974, pp. 1344-1362.

Office Action for U.S. Appl. No. 10/514,661 dated Jun. 16, 2009.

Brockhaus et al., "Diagnostics of a Chemically Active, Pulsed Microwave Plasma for Deposition of Quartz-like Films," Contrib. Plasma Phys. 39 (1999) 5, 399-409.

Grill, Alfred, "Cold Plasma in Materials Fabrication: from Fundamentals to Applications," IEEE Press, Apr. 1994.

Kanazawa et al., "Stable Glow Plasma at Atmospheric Pressure," J. Phys. D: Appl. Phys. 21 (1988), 838-840.

Kanazawa et al., "Glow Plasma Treatment at Atmospheric Pressure for Surface Modification and Film Deposition," Nuclear Instruments and Methods in Physics Research B37/38 (1989), 842-845.

Yokoyama et al., "The Improvement of the Atmospheric-Pressure Glow Plasma Method and the Deposition of Organic Films," J. Phys. D: Appl. Phys. 23 (1990), 374-377.

Office Action for U.S. Appl. No. 10/514,661 dated Jan. 12, 2010.

Klages, Claus-Peter et al., "Surface Functionalization at Atmospheric Pressure by DBD-Based Pulsed Plasma Polymerization," Plasma and Polymers, vol. 5, No. 2, Nov. 24, 2000, pp. 79-89.

Badyal, J.P.S., "Controlled Plasma Chemical Deposition of Polymeric Coatings," Institution of Electrical Engineers, 1999.

Hynes, A.M., et al., "Pulsed Plasma Polymerization of Perfluorocyclohexane," Macromolecules, vol. 29, No. 12, 1996, pp. 4220-4225.

Hynes, A., et al., "Selective Incorporation of Perfluorinated Phenyl Rings During Pulsed Plasma Polymerization of Perfluoroallybenzene," Chem.Mater., vol. 10, No. 8, 1998, pp. 2177-2182.

Office Action from U.S. Appl. No. 10/514,661 dated Oct. 8, 2010.

* cited by examiner

APPLICATION OF A COATING FORMING MATERIAL ONTO AT LEAST ONE SUBSTRATE

CROSS-REFERENCE TO RELATED APPLICATIONS

This application is a National Phase of International Application No. PCT/GB2003/002377 filed on May 30, 2003, which claims priority to GB 0212848.6 filed on Jun. 1, 2002.

The invention of this application relates to the application of a coating and/or conditioning effect onto a substrate. In particular, but not necessarily exclusively the application is performed by the application of a liquid or liquid/solid slurry into an exciting medium to generate a resultant high flux of coating forming material which permits rapid deposition and formation of a coating.

It is known to use a means of monomer atomisation (typically an ultrasonic nozzle) to deposit coatings. Patent WO 9810116 includes examples which use relatively high powers (~90 W) that produce continuous plasma to create cross linked products with poor structural retention. For example, the polyHEMA coating created is amber coloured whereas a good quality coating would be expected to be translucent.

The patent WO 0228548 refers to atmospheric pressure continuous plasmas and indicates that retention of the chemical properties of the atomised liquid is an inevitable consequence of continuous high-rate deposition.

Both patents WO9738801 and WO9858117 describe the application of coatings. However, the latter does not mention the use of atomised liquid coating forming materials (all monomers are implicitly gaseous) and the former appears to specifically describe a two-step process. Thus, in both cases the deposition rate is slow and, as a result, commercial implementation problematical.

The aim of the present invention is to provide an improved method and system for the application of surface coatings which allows the introduction of a coating forming material into an excitation medium which, in turn, allows the application of higher quality coatings to substrates.

In a first aspect of the invention there is provided a method for depositing a coating onto a substrate, said method comprising the introduction of an atomised coating forming material into an exciting medium, said exciting medium causing activation of the atomised coating forming material prior to the material being deposited onto a substrate to form the coating thereon and characterised in that the exciting medium is pulsed.

The pulsing of the excitation medium results in the formation of a coating that significantly retains the chemical properties of the atomised coating forming material introduced into the exciting medium. The use of the atomiser to introduce the coating forming material enables rapid material deposition rates to be achieved even from low vapour pressure materials.

In one embodiment, additional material or materials is/are added to the flow of the atomised coating forming material. The additive materials act as buffers which act to maintain the process pressure and/or carry the atomised coating forming material.

The additive materials can have the additional capacity to modify and/or be incorporated into the coating forming material and/or the resultant coating.

In one embodiment, the introduction of the additional materials to the atomised coating forming material is pulsed.

In one embodiment the exciting medium is a pulsed plasma discharge which can be selectively operated at atmospheric, sub-atmospheric or low-pressure. In one embodiment the pulsed plasma discharge is generated by an alternating current voltage. In another embodiment, the pulsed plasma is produced by audio-frequencies, radio-frequencies or microwave-frequencies. In a yet further embodiment, the pulsed plasma is produced by direct current voltage.

In another form, the exciting medium is created by a pulsed flux of electromagnetic radiation such as UV light or $\gamma$-radiation, or a pulsed flux of ionised particles such as ions, electrons or $\alpha$-radiation, or a pulsed flux of radicals, or by more than one of the means described, whether singly in succession, in simultaneous combination, or in a succession of combinations.

In one embodiment, the substrate to which the coating material is applied is located substantially inside the pulsed exciting medium during coating deposition or alternatively is deposited onto a substrate located outside of the pulsed exciting medium, thus avoiding excessive damage to the substrate or coating.

In a further aspect of the invention there is provided a method of producing a multi-layered material coating on a substrate characterised in that the substrate is repeatedly exposed to excited coating forming material produced as herein described.

In one embodiment the composition of the precursor and/or the nature of the exciting medium are changed during the coating formation.

In one embodiment the coating formed on the substrate is post-treated by exposure to an exciting medium and/or is pre-treated prior to coating by exposure to the exciting medium prior to coating deposition.

The substrate can comprise, but is not limited to: metal, glass, semiconductor, ceramic, polymer, woven or non-woven fibres, natural fibres, synthetic fibres, cellulosic material, or powder.

The coating forming material can constitute, but is not limited to, an organic, organosilicon, organometallic, or inorganic material, or mixtures thereof.

The coating can be selected to increase any, or any combination of, the hydrophobic and/or oleophobic, adhesive, gas barrier, moisture barrier, release, electrical and thermal conductivity, dielectric, optical or tribological properties of the substrate.

In one embodiment, the atomiser is an ultrasonic nozzle supplied with coating forming material in the form of a liquid or liquid/solid slurry. The atomiser used can be a nebulizer supplied with coating forming material in the form of a liquid or liquid/solid slurry, and a carrier gas which may be inert or reactive. Alternatively, the atomiser is a plain-jet gas blast atomiser supplied with coating forming material in the form of a powder, and a carrier gas which may be inert or reactive.

More than one atomiser can be used to supply coating forming material to the excitation medium.

If required, the excitation medium and surrounding apparatus are heated, and the coated substrate can be subject to subsequent derivatization by methods known in the art (e.g. tethering of biomolecules).

In a further aspect of the invention there is provided a method for depositing a coating formed from a liquid coating forming material (such as an organic or organo-silicon monomer or oligomers) or a liquid mixed with substantially insoluble particles (a liquid/solid slurry), characterised in that said method comprises the steps of atomising or nebulizing the coating forming material and introducing it into a pulsed exciting medium (preferably a plasma) that facilitates the formation of activated precursor species to the coating (such as monomeric or oligomeric radicals and ions), these precursor species deposited onto a substrate, forming the coating.

The pulsing of the excitation medium produces coatings that retain the chemical properties of the atomised coating forming material to a far greater extent compared to the conventional non-pulsing counterpart. The use of an atomiser enables rapid deposition even from low vapour pressure materials.

In a preferred embodiment of the method, the coating forming material, either a liquid or liquid/solid slurry, is atomised by an ultrasonic nozzle into an excitation zone, heated to prevent condensation. Other means of atomising the coating forming material include, but are not limited to, nebulizers and plain-jet air blast atomizers.

In one embodiment, the exciting medium contains the atomised coating forming material in the absence of other materials or mixed with, for example, an inert or reactive gas. The additional material may be introduced into, prior to, or subsequent to the excitation chamber continuously or in a pulsed manner by way of, for example, a gas pulsing valve.

In a further aspect of the invention there is provided apparatus for the application of a coating to a substrate, said apparatus comprising a vacuum chamber, atomising means for introducing atomised coating forming material into the chamber, means for creating an exciting medium within the chamber, and a means for introducing and holding a substrate to be coated in the chamber, said atomising means directing the atomised coating forming material to pass through the exciting medium prior to reaching the substrate and characterised in that the means for creating the exciting medium is controlled so as to generate the exciting medium in a pulsed manner.

The foregoing summary as well as the following detailed description of the preferred embodiment of the invention will be better understood when read in conjunction with the appended drawings. It should be understood, however, that the invention is not limited to the precise arrangements and instrumentalities shown herein. The components in the drawings are not necessarily to scale, emphasis instead being placed upon clearly illustrating the principles of the present invention. Moreover, in the drawings, like reference numerals designate corresponding parts throughout the several views.

Figure 2:
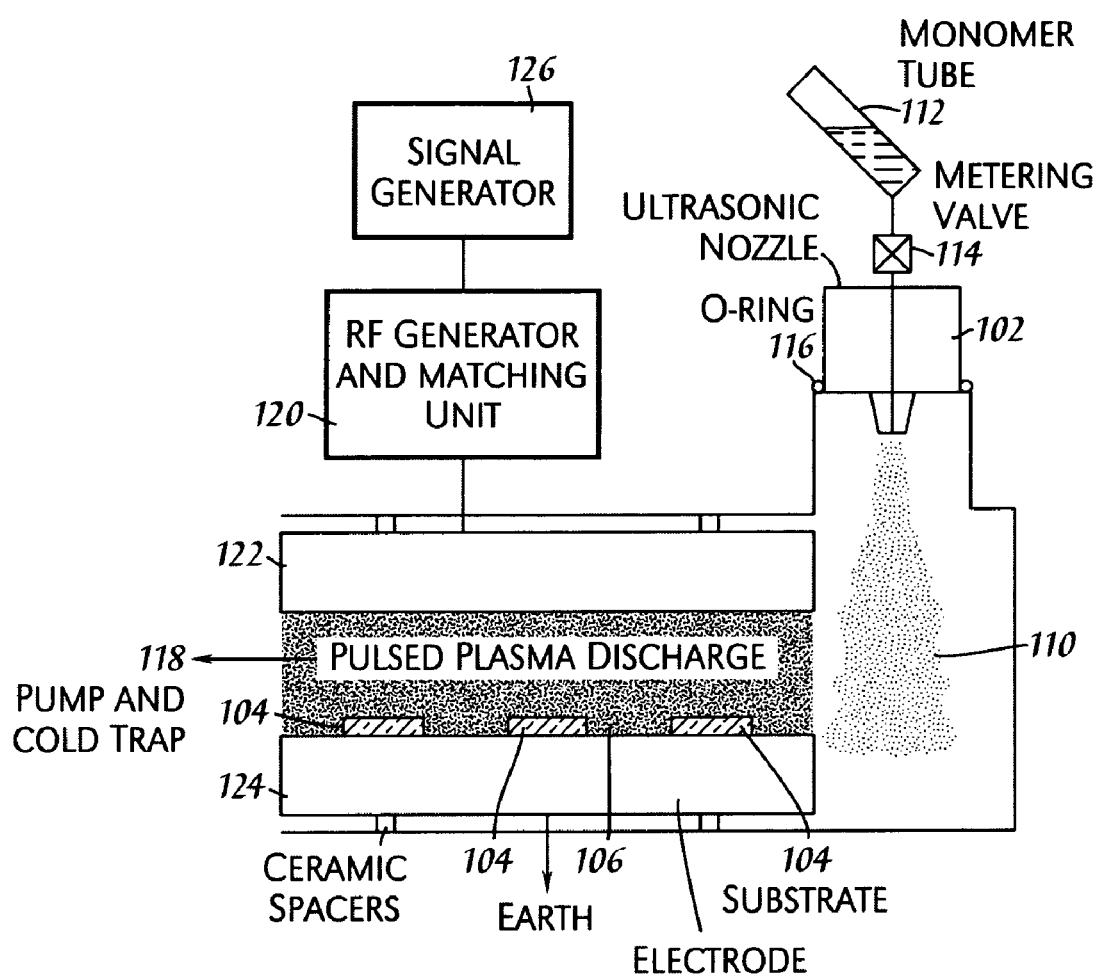

The invention may take physical form in certain parts and arrangement of parts. For a more complete understanding of the present invention, and the advantages thereof, reference is now made to the following descriptions taken in conjunction with the accompanying drawings. Specific examples of the invention are now described with reference to the accompanying drawings wherein:

FIGS. 1a and b illustrate two embodiments, in schematic fashion, of the method of the invention; and FIG. 2 illustrates apparatus that uses a pulsed radio frequency plasma to effect deposition of atomised coating forming materials.

Although the invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

With reference to FIGS. 1a and b there is shown an atomiser 2, substrate 4, and exciting medium 6.

Figure 1B:
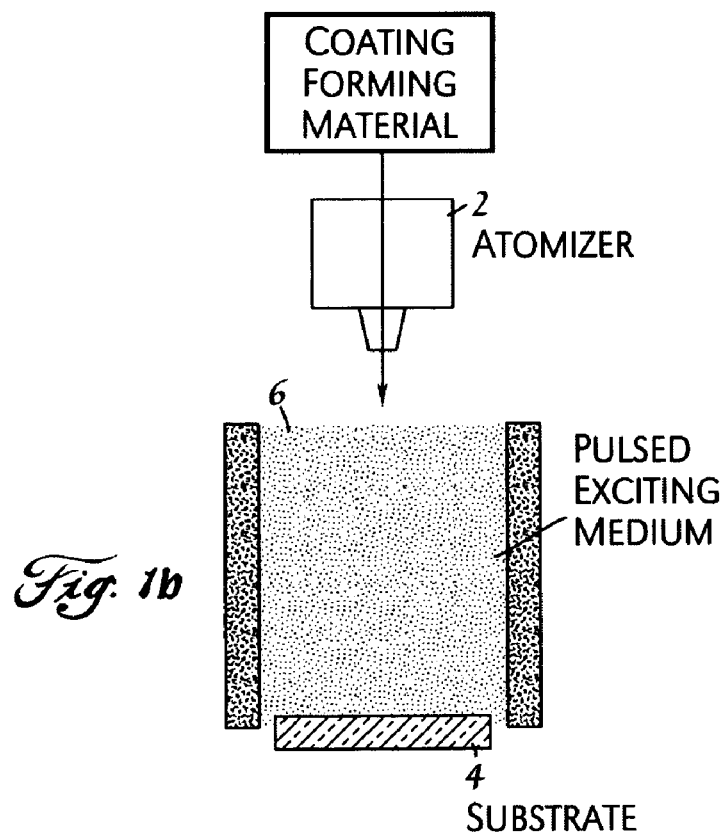

The exciting medium 6 shall, in its preferred embodiments, constitute a pulsed plasma discharge ignited surrounding, (FIG. 1a), or in a region downstream of, (FIG. 1b), the source 2 of atomised coating forming material. Suitable plasmas for use in the method of the invention include non-equilibrium plasmas such as those generated by audiofrequencies, radiofrequencies (RF), microwaves or direct current. The plasma may operate at low-pressure, atmospheric or sub-atmospheric pressures. Of special utility are: low-pressure radio-frequency plasmas wherein the gas pressure is 0.01 to 10 mbar and atmospheric-pressure-glow-discharges (APGDs) which typically utilise a high flux of carrier gas (usually helium or argon) and a high frequency power supply (1 kHz to RF).

Precise conditions under which pulsed plasma deposition can take place in an effective manner will vary depending upon factors such as the nature of the atomised coating forming material or the substrate and can be determined using routine methods. In general however, coating is effected by applying a pulsed high frequency voltage in a sequence that yields very low average powers for example of less than 10 W and preferably of less than 1 W. An example of such a sequence is one in which the power is on for 20 µs and off for 20000 µs.

The greater level of structural retention that pulsed plasma deposition provides can in many cases be attributed to free radical polymerisation occurring during the duty cycle off-time of the pulse and less fragmentation and VUV/ion bombardment during the on-time.

Alternative pulsed means for exciting the atomised coating forming material prior to deposition include, but are not limited to: pulsed UV/VUV irradiation (using sources such as those manufactured by Xenon Corporation), pulsed ion beams, and pulsed electron beam treatment. Means of pulsing these excitation sources, in addition to electronic switching, include rotating shutters and grids possessing a modulated electrical bias capable of intermittently preventing the transit of appropriately charged species.

It is envisaged that multi-layer coatings may be produced by a variety of means: such as pulsing the atomisation source, pulsing the introduction of reactive, additive species to the excitation medium (e.g. intermittently adding oxygen to a plasma); changing the location of substrate during coating; changing the duty cycle of the pulsed excitation medium (e.g. alternating between long and short plasma on times to produce alternating cross-linked and well-retained layers); changing the nature of the excitation medium (e.g. from pulsed plasma to pulsed UV); changing the composition of the coating forming material, and performing multiple treatments (with one or more apparatuses).

The invention will now be particularly described by way of example with reference to FIG. 2 which shows a diagram of an apparatus that is used to perform the examples now described. The apparatus includes a pulsed radiofrequency plasma 106 to effect deposition of atomised coating forming materials 110 dispensed from atomiser 102 onto substrates 104.

The examples are intended to illustrate the present invention but are not intended to limit the same.

Example 1

Deposition of Hydrophobic/Oleophobic Films 1H, 1H, 2H, 2H perfluorooctylacrylate is placed into monomer tubes 112 having been purified using repeated freeze-pump-thaw cycles. Coating deposition experiments are performed in an apparatus consisting of ultrasonic atomisation nozzles 102 interfaced with a capacitively-coupled radiofrequency plasma reactor 106. A monomer tube is connected to each ultrasonic nozzle by way of a metering valve 114. The ultrasonic nozzle themselves are connected to the plasma-reactor by way of "nitrile" O-rings 116.

A "Pirani" pressure gauge is connected to the capacitively coupled plasma chamber. An inlet valve is connected with the external, ambient air supply and a butterfly valve leads to an Edwards E2M28 two stage rotary pump by way of a liquid nitrogen cold trap 118. All connections are grease free.

An L-C matching unit and a power meter are used to couple the output from a 13.56 MHz RF generator 120 to the parallel electrodes 122, 124 that describe the plasma excitation volume 106. This arrangement minimises the standing wave ratio (SWR) of the power transmitted from the RF generator to the partially ionised gas in the plasma excitation volume. The plasma is pulsed by using a pulsed signal generator 126 to trigger the output from the RF generator and a cathode ray oscilloscope to monitor the pulse width and amplitude. The average power <P> delivered to the system during pulsing is given by the following formula:

$$<P> = P_{CW}\{T_{on}/(T_{on}+T_{off})\}$$

where $T_{on}/(T_{on}+T_{off})$ is defined as the duty cycle and $P_{CW}$ is the average continuous wave power.

Prior to the deposition of the coating forming material the ultrasonic nozzles, metering valves and related fittings are rinsed with propan-2-ol and air-dried. The monomer tube, ultrasonic nozzle, metering valve and related fittings are then attached to the plasma reactor which has been previously cleaned with a continuous RF oxygen plasma. Next the silicon substrates are placed onto the lower electrode of the plasma reactor and the apparatus evacuated to base pressure ($2 \times 10^{-3}$ Torr).

The metering valves are then opened until the liquid monomer flows into the ultrasonic nozzles at a rate of $8 \times 10^{-4}$ ml s$^{-1}$. Switching on the ultrasonic generators (3.0 W) initiates atomisation of the coating forming material, resulting in an increase in the chamber pressure to 1.1 Torr. The pulsed plasma is then ignited. Typically a 0-10 minute deposition duration is used, and found to be sufficient to give complete coverage of the substrate. After this the metering valve 114 is closed, the RF 120 and signed 126 generators switched off, and the apparatus evacuated before finally venting to atmospheric pressure.

A spectrophotometer (Aquila Instruments nkd-6000) is used to determine the thickness of the coatings. Contact angle measurements are made with a video capture apparatus (AST Products VCA2500XE) using sessile 2 µL droplets of deionised water and n-decane as probe liquids for hydrophobicity and oleophobicity respectively.

Table 1 shows the results of 10 minutes of deposition onto silicon wafers in accordance with the method of this example where:

$P_{CW}$=40 W
$P_{on}$=200 microseconds
$T_{off}$=10 milliseconds

TABLE 1

| Coating Forming Material | Deposition Duration/ min | Film Thickness/ nm | Contact Angle/° Water | Contact Angle/° Decane |
|---|---|---|---|---|
| 1H, 1H, 2H, 2H perfluorooctylacrylate | 8 | 680 | 128 | 74° |

In Table 1 it can be seen that the method of the invention enables the rapid pulsed plasma deposition of thick films from a monomer possessing low volatility. The water contact angle results confirm that the films are hydrophobic and the decane contact angles are indicative of a good degree of oleophobicity (and hence structural retention).

Example 2

Deposition of a Hydrophilic Coating

In a second illustrative example the method and apparatus of Example 1 above are repeated using 2-hydroxyethyl methacrylate as the coating forming material. In this case, the conditions were:

$P_{CW}$=40 W
$P_{on}$=200 microseconds
$T_{off}$=10 milliseconds 5 minutes of deposition onto silicon wafers gave rise to a film thickness of 210 nm.

The hydrophilicity of the deposited coatings are assessed by water contact angle measurements with a video capture apparatus (AST Products VCA2500XE) using sessile 2 µL droplets of deionised water.

The water contact angle of coatings deposited onto polished silicon wafers is 28±2°, confirming that they are indeed hydrophilic. The films formed were observed to be smooth and clear.

The invention claimed is:

1. A method for depositing a coating formed from a liquid coating forming material or a liquid mixed with substantially insoluble particles onto a substrate, said method comprising atomising the coating forming material, introducing the atomised coating forming material into an exciting medium, said exciting medium causing activation of the atomised coating forming material prior to, or prior to and during, the material being deposited onto a substrate to form the coating thereon, the substrate surface to which the coating is applied is located inside the pulsed exciting medium during coating deposition and characterised in that the exciting medium, into which the atomised coating forming material is introduced, is pulsed and forms activated precursor species to the coating in the form of monomeric or oligomeric ions or radicals, these activated precursor species deposited onto the substrate to form the coating.

2. A method according to claim 1 characterised in that a plurality of atomizers are used to introduce the coating forming material with each atomizer having a monomer supply connected thereto.

3. A method according to claim 1 characterised in that the exciting medium is a pulsed plasma discharge selectively operated at atmospheric pressure.

4. A method according to claim 1 characterised in that the exciting medium is a pulsed plasma discharge selectively operated at less than atmospheric pressure.

5. A method according to claim 1 characterised in that at least one additional material is added into the atomised coating forming material.

6. A method according to claim 5 characterised in that the additive material acts as a buffer to maintain the process pressure and/or carry the atomised forming material.

7. A method according to claim 5 characterised in that the additive material modifies and/or is incorporated into the atomised coating forming material and/or the resultant coating.

8. A method according to claim 5 characterised in that the introduction of the additional materials to the atomised coating forming material is pulsed.

9. A method according to claim 1 characterised in that the exciting medium is a pulsed plasma charge.

10. A method according to claim 1 characterised in that the exciting medium is created by a pulsed flux of electromagnetic radiation.

11. A method according to claim 1 characterised in that the exciting medium is created by a pulsed flux of ionised particles or radicals.

12. A method of producing a multi-layered material coating on a substrate characterized in that the substrate is repeatedly exposed to excited coating forming material produced in accordance with the method of claim 1, 2, 3, 4, 5, 6, 7, 8, 9, 10, or 11.

13. A method according to claim 12 characterised in that the nature of the exciting medium is changed during the coating formation.

14. A method according to claim 12 characterised in that the coating formed on the substrate is post-treated by exposure to an exciting medium.

15. A method according to claim 12 characterised in that the substrate is pre-treated prior to coating by exposure to the exciting medium prior to coating deposition.

16. A method according to claim 1 characterised in that the substrate is any of metal, glass, semiconductor, ceramic, polymer, woven or non-woven fibres, natural fibres, synthetic fibres, celluloaic material, or powder.

17. A method according to claim 1 characterised in that the coating forming material comprises an organic, organosilicon, organometallic, or inorganic material; or mixtures thereof.

18. A method according to claim 1 characterised in that the atomised coating forming material is deposited via an ultrasonic nozzle supplied with coating forming material in the form of a liquid or liquid/solid slurry.

19. A method according to claim 1 characterised in that the atomised coating forming material is deposited via a nebulizer supplied with coating forming material in the form of a liquid or liquid/solid slurry and a carrier gas.

20. A method according to claim 1 characterised in that the atomised coating forming material is deposited via a plain-jet gas blast atomizer supplied with coating forming material in the form of a powder, and a carrier gas.

21. A method according to claim 1 characterised in that the excitation medium is heated.

22. A method according to claim 1 characterised in that the coated substrate is subject to derivatization.

23. A method according to claim 1 characterised in that the liquid is an organic or organo-silicon monomer or oligomers.

24. A method according to claim 1 characterised in that the exciting medium contains the atomised coating forming material in the absence of other materials.

25. A method for depositing a coating onto a substrate, said method comprising the introduction of an atomised coating forming material into an exciting medium, said exciting medium causing activation of the atomised coating forming material prior to, or prior to and during the material being deposited onto a substrate to form the coating thereon, the exciting medium being pulsed, the substrate being repeatedly exposed to excited coating forming material, wherein the nature of the exciting medium is changed during the coating formation.

26. A method according to claim 25 wherein the coating formed on the substrate is post-treated by exposure to an exciting medium.

27. A method according to claim 25 wherein the substrate is pre-treated prior to coating by exposure to the exciting medium prior to coating deposition.

* * * * *

UNITED STATES PATENT AND TRADEMARK OFFICE
CERTIFICATE OF CORRECTION

| | | |
|---|---|---|
| PATENT NO. | : 8,029,872 B2 | Page 1 of 1 |
| APPLICATION NO. | : 10/516448 | |
| DATED | : October 4, 2011 | |
| INVENTOR(S) | : Luke Ward | |

It is certified that error appears in the above-identified patent and that said Letters Patent is hereby corrected as shown below:

Title Page, Item (73) Assignee, replace "P2i Limited" in Assignee name with --Surface Innovations Limited--.

Signed and Sealed this
Second Day of October, 2012

David J. Kappos
*Director of the United States Patent and Trademark Office*